United States Patent [19]

Bandoh

[11] 4,194,865

[45] Mar. 25, 1980

[54] INSERT LOADING APPARATUS IN TRANSFER ENCAPSULATION

[75] Inventor: Kazuo Bandoh, Kyoto, Japan

[73] Assignee: Dai-Ichi Seiko Co., Ltd., Japan

[21] Appl. No.: 904,961

[22] Filed: May 11, 1978

[30] Foreign Application Priority Data

May 12, 1977 [JP] Japan .............................. 52-55120
Dec. 23, 1977 [JP] Japan ............................. 52-155894

[51] Int. Cl.$^2$ .................................................. B65G 1/08
[52] U.S. Cl. ....................................... 414/403; 53/537
[58] Field of Search .................. 414/403, 404, 425; 53/537

[56] References Cited

U.S. PATENT DOCUMENTS

| | | | |
|---|---|---|---|
| 3,263,841 | 8/1966 | Wanesky | 414/403 |
| 3,286,740 | 11/1966 | Fuchs, Jr. | 414/404 X |
| 3,308,977 | 3/1967 | Cochran | 414/404 X |
| 3,921,788 | 11/1975 | Roberson, Jr. | 414/404 X |
| 4,124,132 | 11/1978 | Pennings | 414/403 |

*Primary Examiner*—Stephen G. Kunin
*Assistant Examiner*—Terrance L. Siemens
*Attorney, Agent, or Firm*—Jones, Tullar & Cooper

[57] ABSTRACT

An apparatus for loading inserts to be encapsulated from cartridges into a loading frame is disclosed. The apparatus comprises a loading frame base provided with a plurality of guide members, stopping members arranged on the loading frame base for positioning inserts on the guide members, hydraulic cylinders for lifting up the loading frame to load the inserts on the guide members into the loading frame, and an insert feeding mechanism arranged at the rear end of the loading frame base and composed of a cartridge base on which cartridges are placed, and apparatus for intermittently elevating the cartridge base. In operation, inserts contained in cartridges slide along the grooves of the guide members, whereby they are positioned on the guide members, and then loaded into the loading frame by raising motion of the loading frame.

5 Claims, 13 Drawing Figures

INSERT LOADING APPARATUS IN TRANSFER ENCAPSULATION

This invention relates to transfer molding for encapsulating or molding plastics around electric or electronic components, such as integrated circuits, transistors, diodes, electric parts and the like. More particularly, it relates to an apparatus for loading inserts to be encapsulated into a loading frame. While reference is primarily made hereinafter to the apparatus as it applies to loading integrated circuits to be encapsulated from cartridges into a loading frame, it is to be understood that the invention also has application for loading other electric or electronic components into a loading frame.

In transfer encapsulation of integrated circuits, it is required to load integrated circuit tips, each of which is provided on a stem lead frame, into each cavity of a multi-cavity transfer mold, so that it is conventional in the past to use a loading frame. The stem lead frames provided with integrated circuit tips (hereinafter termed of the kind) are loaded into the loading frame and this is then inserted into the mold to place the integrated circuit tips in position.

Up to now, the loading of stem lead frames of the kind into a loading frame has been carried out manually. Since this work has to be carried out rapidly and exactly without doing damage to the stem lead frames of the kind, it demands skilled workers. Further, if the number of cavities of the mold increases, loading time becomes longer, and hence, it results in the considerable lowering of molding efficiency and the increase of exhaustion of the workers. Accordingly, the loading work has been a bar to encapsulation of integrated circuits with a multi-cavity transfer mold.

It is therefore an object of the present invention to provide an apparatus for loading inserts to be encapsulated from cartridges into a loading frame.

According to the present invention, there is provided an apparatus for loading inserts to be encapsulated from cartridges into a loading frame, comprising a loading frame base provided with a plurality of guide members, said loading frame base being mounted on a framework in an inclined position, means for stopping the inserts in position on the guide members, said stopping means being arranged on the loading frame base, means for lifting up a loading frame to load the inserts on the guide members into a loading frame, and an insert feeding mechanism arranged at the rear end of the loading frame base, by which inserts are periodically fed from the cartridge to the guide members, said insert feeding mechanism comprising a cartridge base on which cartridges are placed, and means for intermittently elevating the cartridge base.

The invention will be further apparent from the following description with reference to the several figures of the accompanying drawings which show, by way of example only, two forms of an apparatus embodying the invention.

In order to facilitate understanding of a detailed description of the various parts of the apparatus, it may be helpful to first provide a general operation description.

Figure 1:
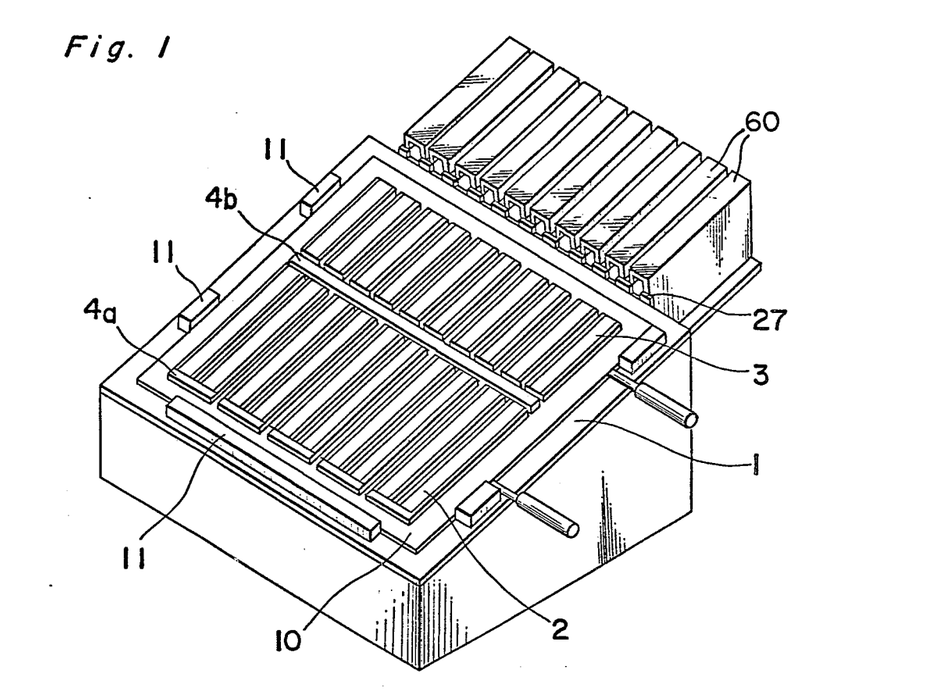
FIG. 1 is a diagrammatic perspective view of the apparatus of the present invention.
Figure 2:
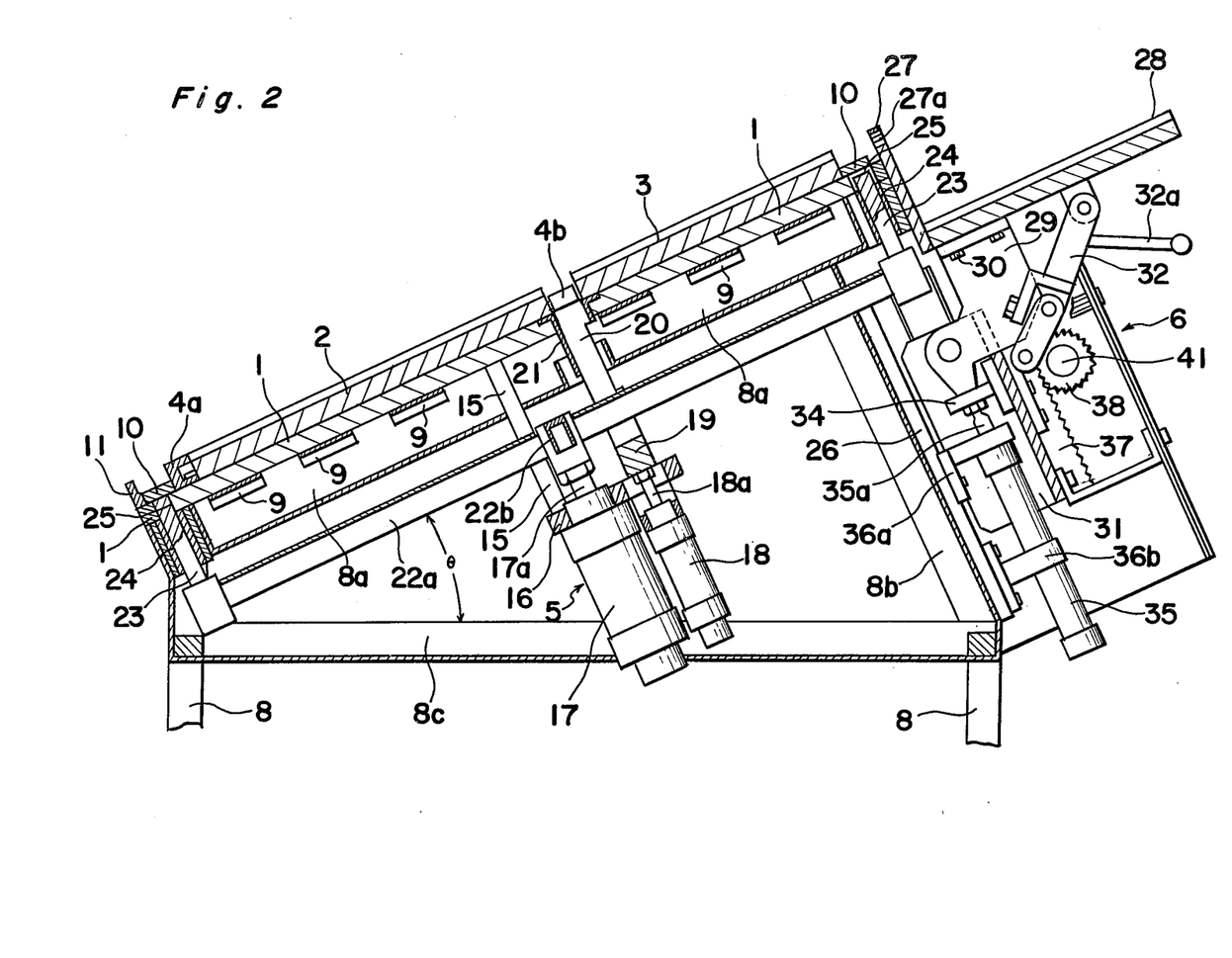
FIG. 2 is a sectional side elevation of the apparatus illustrated in FIG. 1.

With reference to FIGS. 1 and 2, a cartridge base 28 initially positioned in horizontal position has been pivoted to inclined position after arranging the cartridges 60 thereon in side-by-side relationship. In inclined position, stem lead frames of the kind are prevented from sliding motion by a gate plate 27. After placing a lower half of a loading frame 10 on an inclined loading frame base 1, the cartridge base 28 is raised to a position where the uppermost stem lead frames of the kind are set free from the gate plate 27, whereby the uppermost stem lead frames of the kind are fed from cartridges onto rear ends of upper guide members 3 and begin to slide on the guide members 3 along grooves provided therein. A movable stopping member 4b has been lowered to the lowest position allowing the stem lead frames of the kind to pass over the stopping member 4b, so that the stem lead frames of the kind moves from the guide members 3 to guide members 2 and are then stopped at the front ends of the guide members 2 by stopping members 4a in position. The movable stopping member 4b is then raised to the uppermost position, while the cartridge base 28 is further raised, whereby the next stem lead frames are set free from the gate plate 27 and fed from the cartridges 60 to rear ends of guide members 3 and begin to slide thereon. Since the movable stopping member 4b has been raised, the stem lead frames of the kind are stopped in position on the guide members 3. The lower half of the loading frame is then raised to load the stem lead frames into the lower half of the loading frame 10 and an upper half of the loading frame 10 is placed on the lower half of the loading frame to hold the stem lead frames of the kind in position, and the loading frame 10 is then taken out manually or mechanically, whereby the loading work is completed.

Referring now to FIGS. 1 to 10, there is illustrated one from of an apparatus of the present invention for loading stem lead frames of the kind from cartridges 60 into a loading frame 10. The apparatus includes in its general organization a framework 8 comprising frame members 8a, 8b and 8c so arranged that they form a spaced pair of parallel triangles. The frame members 8a are attached at an angle, $\theta$, of inclination to the horizontal frame members 8c and provided with reinforcing members 8 extending between them. The frame members 8b are at right angles to the frame members 8a, respectively.

Figure 3:
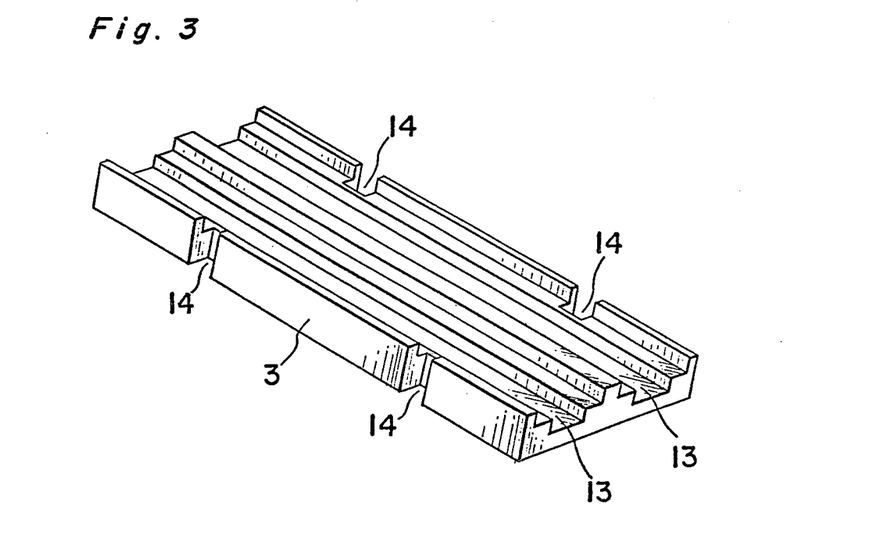
FIG. 3 is a perspective view of a guide member used in the apparatus of FIGS. 1 and 2.
Figure 4:
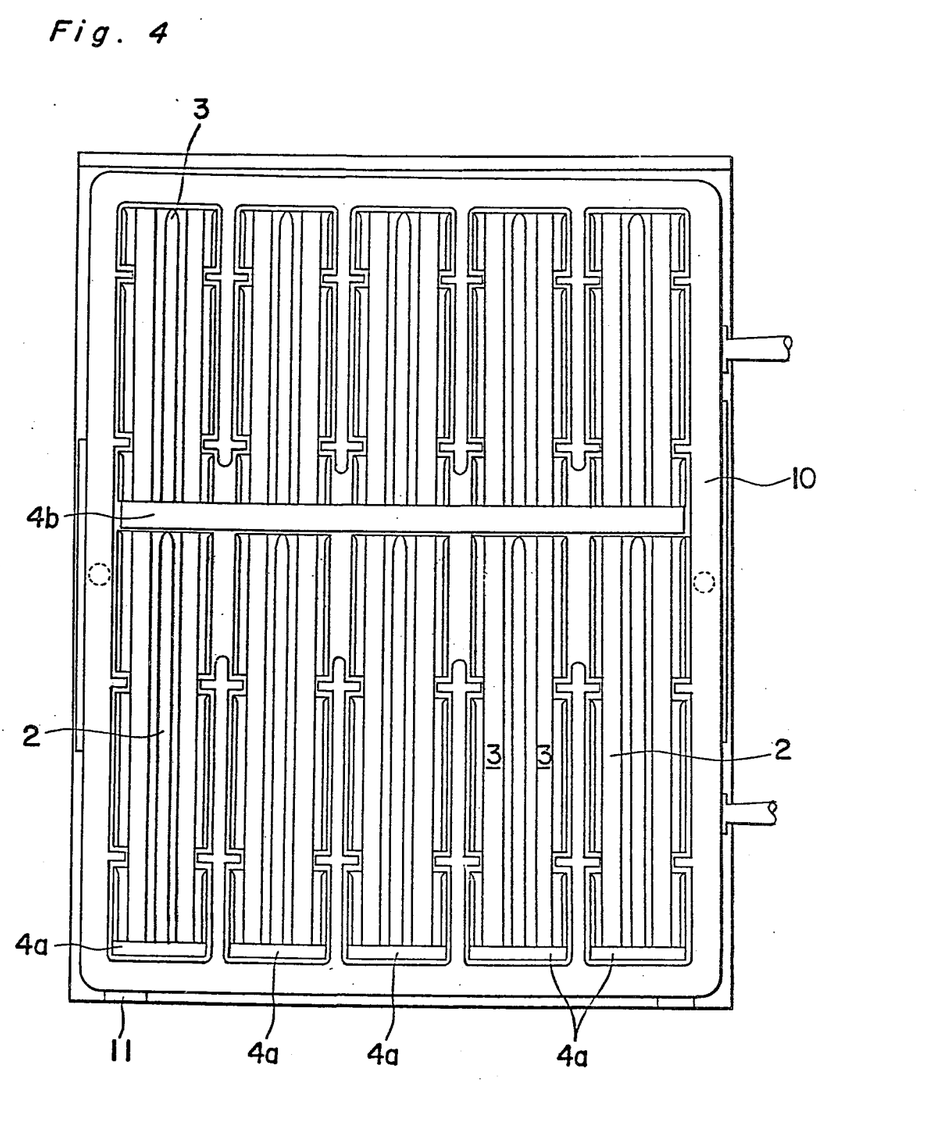
FIG. 4 is a partial plan view of the apparatus of FIGS. 1 and 2.
Figure 5:
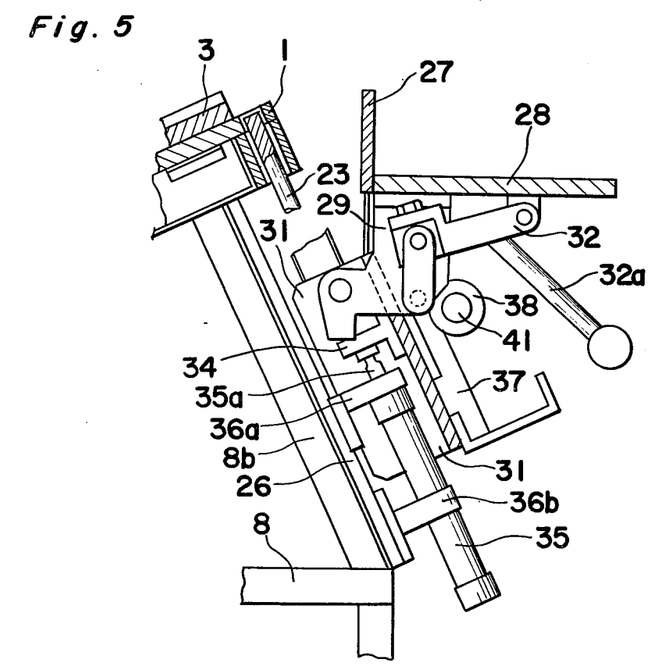
FIG. 5 is a side elevation of the insert feeding mechanism used in the apparatus of the invention with certain parts broken away and other parts removed for clarity.

A loading frame base 1 is mounted on the inclined frame members 8a so that it will have the same inclination angle θ that the frame members 8a have. The inclination angle θ of the loading frame base 1 may range from 15° to 40°, preferably from 20° to 35°. As illustrated in FIGS. 1 and 4, the loading frame base 1 is provided with a plurality of guide members 2 and 3 each having two parallel grooves 13 along the entire length thereof and four U-shaped notches 14 at both sides, as shown in FIG. 3. The guide members 2 and 3 are arranged in a rectangular lattice shape with proper separations. Several positioning members 11 and 12 are arranged on the front end and both sides of the loading frame base 1, whereby a loading frame 10 is placed in position when it is loaded into the apparatus.

Adjacent to each front end of guide members 2 there is provided a fixed stopping member 4a, by which stem lead frames of the kind sliding down the guide members 2 and 3 are stopped in position on the guide members 2. A movable stopping member 4b is arranged at a position adjacent to the each front end of the upper guide members 2 across the width of the loading frame base 1, and can be raised and lowered by the rod 18a of a hydraulic cylinder 18 as mentioned below.

As shown in FIG. 2, a supporting plate 16 is disposed at the underside of the central region of the base 1 with supports 15 and provided with double-acting hydraulic cylinders 17 and 18. The cylinder 18 is provided at its piston rod 18a with an arm 19 extending parallel to the movable stopping member 4b. At each free end of the arm 19 there is provided a push rod 20 extending through a sleeve 21 provided in the base 1, and being attached to the bottom of the movable stopping member 4b. Thus, the stopping member 4b is raised and lowered by the operation of the cylinder 18 constituting stopping means together therewith.

Means for lifting the loading frame 10 comprises a hydraulic cylinder 17, the piston rod 17a of which is provided with arms 22a and 22b perpendicularly intersecting each other. The arms 22a and 22b are provided at their free ends with push rods 23 extending upwardly into a sleeve 24 provided in the base 1 and terminating at a position lower than the surface of the base 1 when piston rod is lowered. When the cylinder 17 is operated, the loading frame 10 is raised to a position higher than the surface of the guide members. During raising motion of the loading frame, the stem lead frames on the guide members 2 and 3 are loaded into the lower half of the loading frame 10.

An insert feeding mechanism is mounted on a rear plate 26 attached to the frame members 8b. The mechanism 6 comprises a cartridge base 28 pivotally connected to a slide plate 31 slidably mounted on the rear plate 26, a link mechanism for pivoting the cartridge base 28 between horizontal position and inclined position, driving means for periodically elevating the slide plate 31 by steps of a certain distance, said driving means including lock release mechanism for lowering the slide plate 31.

Attached to the bottom of the cartridge base 28 by bolts 30 are a pair of supporting members 29 which are pivotally mounted on the slide plate 31. A link mechanism 32 with a handle 32a is arranged between the cartridge base 28 and the slide plate 31 to pivot the cartridge base 28 from horizontal position to inclined position or vice versa.

Figure 6:
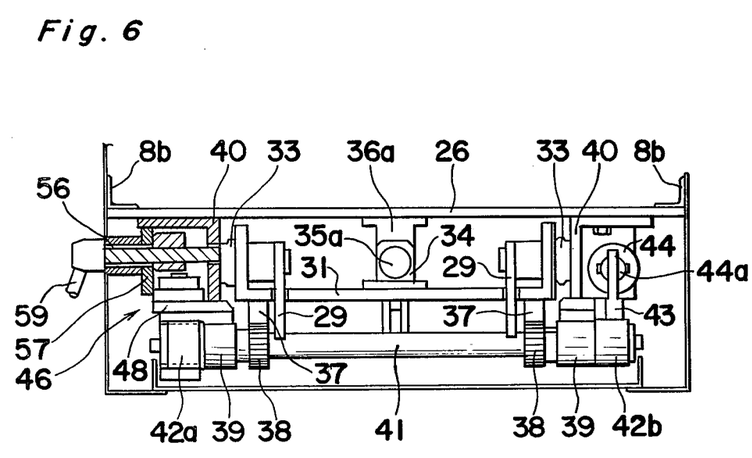
FIG. 6 is a plan view of the insert feeding mechanism with certain parts broken away and other parts removed for clarity.
Figure 7:
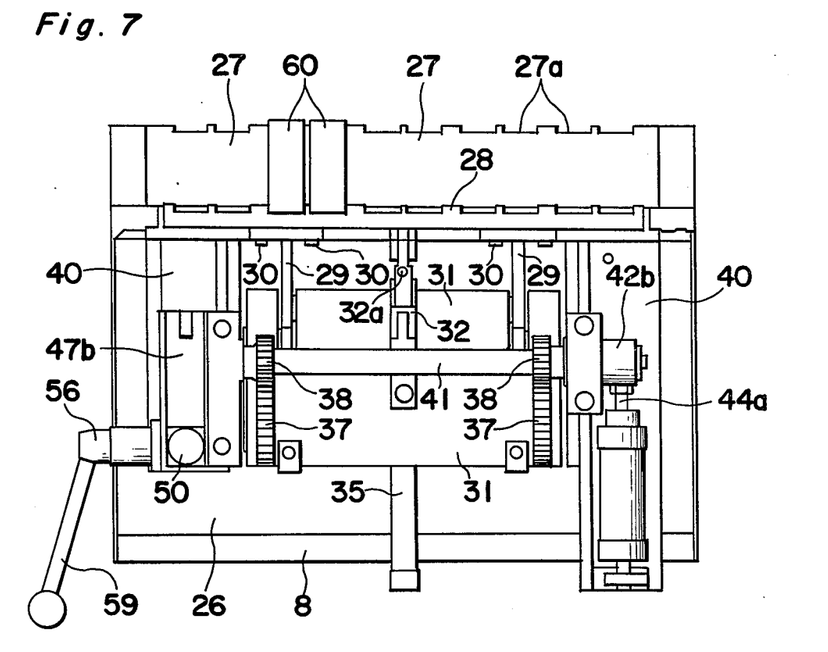
FIG. 7 is a rear elevation of the insert feeding mechanism of FIGS. 5 and 6.

The slide plate 31 is slidably mounted at its side flanges on a pair of vertically extending guide rails 33 and, connected to a piston rod 35a of an oil damper 35 by fitting member 34. The cylinder 35 is vertically fixed to the rear plate 26 by members 36a and 36b, and the guide rails 33 are mounted on a member 40 fixed to the rear plate 26. The slide plate 31 is provided at its rear surface with a spaced pair of vertically extending racks 37 with which a pair of drive pinions 38 are engaged. As illustrated in FIGS. 6 and 7, the drive pinions 38 are fixed to a drive shaft 41 which is mounted in bearings fixed to the member 40. The drive shaft 41 is provided with a pair of one-way clutches 42a, 42b which are arranged adjacent to each bearing 39. A gate plate 27 having a plurality of gates 27a is pivotally connected to the rear plate 26 and forced towards the cartridge base 28 by a spring (not shown). Thus, the gate plate 27 follows the movement of the cartridge base 28.

Figure 8:
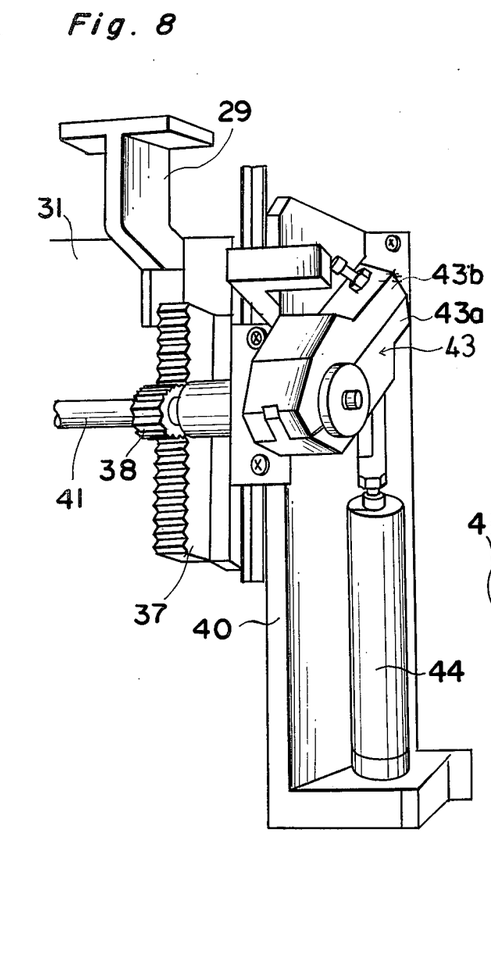
FIG. 8 is a partial perspective view of the insert feeding mechanism showing driving means.
Figure 9:
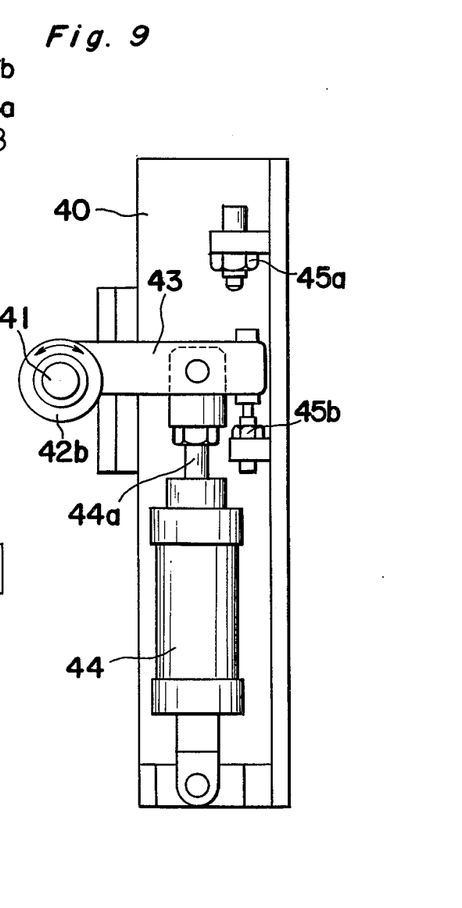
FIG. 9 is a side elevational view illustrating the driving means of the insert feeding mechanism.

As can be seen from FIGS. 8 and 9, the driving means comprises a hydraulic cylinder 44, an arm 43 pivotally connected thereto, a pair of one-way clutches 42a and 42b mounted on a drive shaft 41, and a pair of drive pinions 38 mounted on the drive shaft 41 and engaged with a pair of racks 37 mounted on the slide plate 31. The cylinder 44 is pivotally mounted on the bottom of the member 40, and the piston rod 44a is pivotally connected to the arm 43 constituted in the same manner as the clamping means mentioned below. Thus, raising motion of the piston rod 44a is converted to rotary motion of the drive shaft 41 by the arm 43 and the one-way clutch 42b, which is, in turn, converted to raising motion of the slide plate 31 and the cartridge base 28 by the function of rack and pinions. In order to keep the raising distance of the cartridge base 28 constant, the arm 43 has an extension adapted to be reciprocated between a pair of stoppers 45a and 45b which are mounted on the member 40 at a certain distance to restrict the displacement of the piston rod 44a. During lowering motion of the piston rod 44a, the one-way clutch 42b is released from the locking action of the arm 43, while the other one-way clutch 42a is kept in a locked position by the clamping means. For this reason, the drive shaft 41 is prevented from inverse rotary motion and kept as it is, and hence, the cartridge base 28 is prevented from lowering motion. Accordingly, the cartridge base 28 raises by a predetermined distance whenever the piston rod 44a moves up and down for one time.

Figure 10:
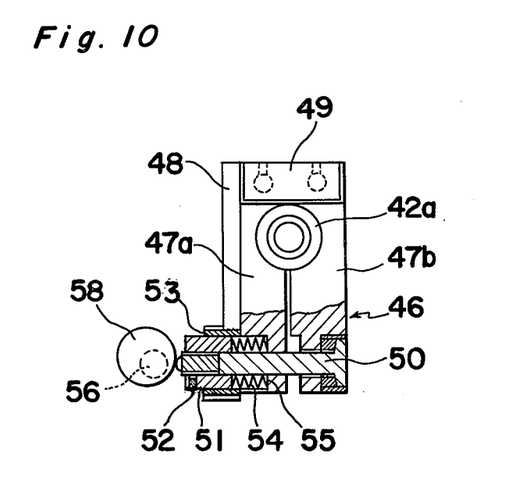
FIG. 10 is a sectional view of lock release means of the insert feeding mechanism.

As can be seen from FIG. 10, the one-way clutch 42a is clamped by the clamping means comprising a pair of clamping members 47a and 47b. A member 49 is pivotally connected at its one end to the one end of the clamping member 47a fixed to the member 40, and pivotally connected at the other end to the one end of the clamping member 47b. Mounted in the other end of the clamping member 47b is a lock release shaft 50 passing through the other end of the clamping member 47a. The clamping member 47a is provided with an annular recess 55 and a cylindrical guide member 53, which are coaxial with the shaft 50. The member 53 has an inside diameter same as the diameter of the recess 55 and forms an extension of the recess. A slide member 51 is slidably mounted in the guide member 53 and screwed on the threaded portion of the shaft 50. The slide member 51 and the shaft 50 are fixed by a bolt 52. The clamping member 47b receives the force from a spring 54 through the release shaft 50 in the direction facing to the clamping member 47a, so that the clutch 42a is clamped firmly. Thus, the clutch 42a allows the drive shaft 41 to rotate only in one direction and prevent the same from the inverse rotation, and hence, the lowering of the cartridge base 28 is prevented when lowering the piston rod 44a.

An operation shaft 56 is mounted in the members 40 and 57 in perpendicular to the drive shaft 50, and provided with an eccentric cam 58 adapted to be in contact with the free end of the drive shaft 50. When a lever 59 mounted on the end of the operation shaft 56 is turned, the drive shaft 50 is moved by the eccentric cam in the reverse direction with respect to the direction of the force from the spring, whereby the clutch 42a is released from the clamping action of the clamping means, and hence, the shaft 41 is released from the locking action of the clutch 42a. Accordingly, the cartridge base and the slide plate 31 are allowed to move downwardly.

When the clutch 42a is released from the locking action of the clamping means, the cartridge base 28 is lowered together with the slide plate 26 by the action of gravity. The lowering rate of the cartridge base 28 is controlled by the oil damper 35 and the shock of the cartridge base when it reaches the lowermost position is softened by the same.

In operation of the apparatus as described above, the cartridge base 28 is initially positioned in horizontal position as shown in FIG. 4 and then pivoted to the inclined position shown in FIG. 2 after placing a plurality of cartiridges 60 on the cartridge base 1, said cartridges 60 containing a plurality of stem lead frames of the kind.

The stopping member 4b is positioned in the lowermost position. A lower half of a loading frame 10 is then placed on the loading frame base 1 in position. When the cylinder 44 is actuated by pushing a button of control board (not shown), the cartridge base 28 is raised by the predetermined distance and hence, the uppermost stem lead frames of the kind pass over the gates 27a of the gate plates 27 and begin to slide along the grooves of the guide members 3.

Figure 12:
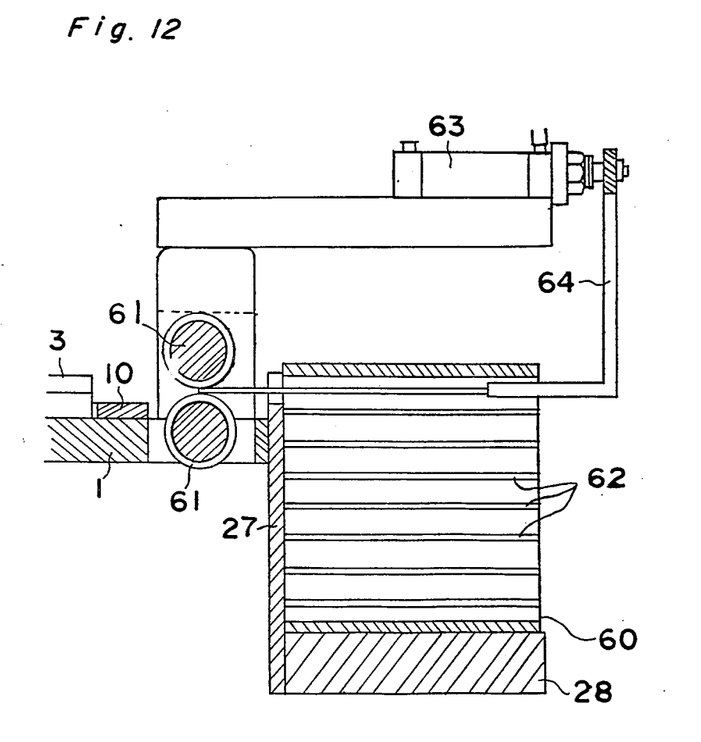
FIG. 12 is a sectional view of a forced feeding mechanism.

In order to accelerate the initial movement of the stem lead frames of the kind, there may be used forced feeding means such as means for applying mechanical shock or vibration on the cartridges or stem lead frames of the kind. As illustrated in FIG. 12, for example, a pair of rollers 61 may be arranged between the gate plate 27 and the rear ends of the guide members 3 to draw out the stem lead frames 62 of the kind. One of the rollers 61 may be driven by an electric motor. Further, forced feeding means may comprises a double-acting hydraulic cylinder 63 and L-shaped fingers 64 attached to the piston rod of the cylinder 63. In operation, each of the fingers forces each of the uppermost stem lead frames 62 of the kind out of the cartridge 60.

When the stem lead frames of the kind reach to the front end of the guide members 2, they are stopped by the members 4a is position. After the stopping member 4b initially positioned in the lowermost position is raised to the uppermost position, the cartridge base 28 is further raised by the predetermined distance, whereby the stem lead frames of the kind pass over the gate plate 27 and slide on the guide members 3. When the stem lead frames of the kind reach to the front ends of the guide members 3, they are stopped by the stopping member 4b. The cylinder 17 is then operated to lift the loading frame to the position higher than the surface of the guide members 2 and 3, whereby the stem lead frames of kind are loaded into the loading frame 10.

After an upper half of the load frame 10 is disposed on the lower half of the loading frame 10, they are taken out from the apparatus. Then the cylinders 17 and 18 are operated to lower the push rods 23 and stopping member 4b, whereby the apparatus is returned to its initial state. Another lower half of the loading frames of the kind is then placed on the loading frame base 1, and the above poeration is repeated.

If the cartridges are emptied, a lever 59 is turned to release the one-way clutch 42a from the clamping action of the clamping members 47a and 47b, whereby the cartridge base 28 is lowered to the lowest position. The cartridge base 28 is then pivoted to the horizontal position, and the empty cartridges are replaced by new ones.

The apparatus of the above embodiment makes it possible to load stem lead frames of the kind into loading frames without skilled workers, and considerably improves the work efficiency. Further, the apparatus can be applied to any conventional loading frames with minor modifications, for example, by changing the arrangement of guide members and cartridge base, so that presently used transfer molds can be used effectively as they are.

It will be appreciated that it is not intended to limit the invention to the above example only, many variations such as might readily occur to one skilled in the art, being possible without departing from the scope thereof.

Thus, for example, a link mechanism 32 is need not be provided between a cartridge base and a slide plate, and a hydraulic culinder may be provided between them as means for pivoting the cartridge base.

Further, only a cartridge base is pivoted in the above embodiment, but a insert feeding mechanism may be pivoted as a whole by a suitable means such as hydraulic cylinder.

Figure 11:
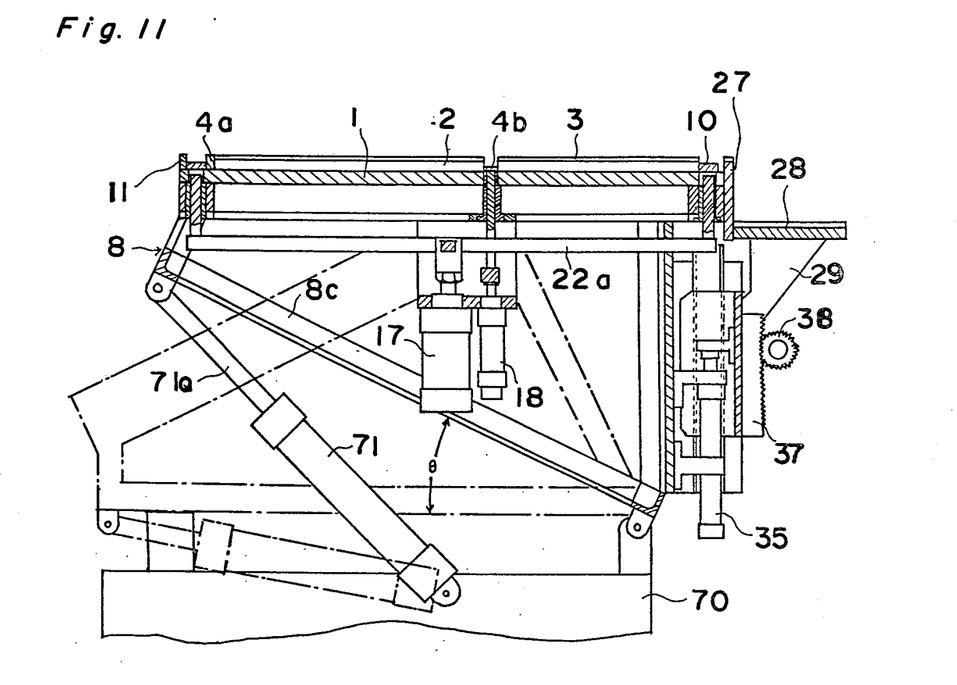
FIG. 11 is a side sectional view of another form of the apparatus of the present invention.

FIG. 11 shows another embodiment of the apparatus of the present invention which has the same construction as the apparatus of FIG. 2 except that a framework 8 is pivotally mounted on the base 70 and that a cartridge base 28 is fixed to a slide plate 31. As can be seen from FIG. 11, the framework 8 is pivotally connected at its rear end to the base 70 and pivotally connected at its front end to the piston rod 71a of a hydraulic cylinder 71 which is pivotally mounted on the base 70. Thus, the framework 8 can be pivoted from horizontal position illustrated by a solid line to an inclined position illustrated by a one dot broken line. Thus, it will be understood that there is no need to provide means for pivoting the cartridge base.

In operation, the frame members 8a are initially positioned in horizontal position by the cylinder 71 so that the loading frame base 1 is kept in horizontal position, cartridges and a loading frame 10 are respectively placed in position. Thus, the operator is free from delicate care and can easily set the loading frame into the apparatus. After the framework 8 is pivoted to inclined position, loading of inserts into the loading frame is carried out in the same manner as described above with reference to FIGS. 1 to 10.

Figure 13:
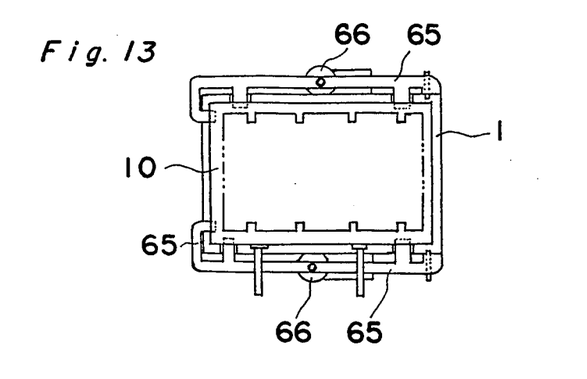
FIG. 13 is a schematic plan view showing a modification of the apparatus of the invention.

In this embodiment, the framework 8 is pivoted whenever the loading frame 10 is to be replaced, but this is not always necessary if an auxiliary pivoting means is provided as shown in FIG. 13. The auxiliary pivoting means comprises a pair of arms 65 pivotally mounted at each end on the rear end of the loading frame base 1, and two hydraulic cylinders 66 pivotally connected the arms 65. When the loading frame 10 is to be replaced, arms 65 are pivoted from inclined position to horizontal position. This auxiliary pivoting means may be applied to the apparatus of FIG. 2.

Further, in the foregoing embodiments there is used a lock release mechanism comprising a drive shaft 50, eccentric cam and an operation shaft 56, but an magnetic clutch may be used instead of the lock release mechanism. In this case, the magnetic clutch is mounted on the drive shaft 41 and arranged between the one way clutch 42a and bearing 39.

What is claimed is:

1. An apparatus for loading inserts to be encapsulated from cartridges into a loading frame, comprising an inclined loading frame base provided with a plurality of guide members, means for stopping the inserts in position on the guide members, said stopping means being arranged on the loading frame base, means for lifting up a loading frame to load the inserts on the guide members into a loading frame, and an insert feeding mechanism elevatably mounted on the rear end of the loading frame base, by which inserts are periodically fed from the cartridges to the guide members, said insert feeding mechanism comprising a cartridge base on which cartridges are placed, means for pivoting said cartridge base between horizontal position and inclined position, and means for intermittently elevating the cartridge base.

2. The apparatus according to claim 1 wherein said loading frame base is inclined at an angle within the range of 15° to 40°.

3. The apparatus according to claim 1 further comprising a forced feeding means comprising a hydraulic cylinder and feeding fingers connected to the rod of the cylinder.

4. An apparatus for loading inserts to be encapsulated from cartridges into a loading frame, comprising a loading frame base provided with a plurality of guide members and mounted on a pivotable framework, means for stopping the inserts in position on the guide members, said stopping means being arranged on the loading frame base, means for lifting up a loading frame to load the inserts on the guide members into a loading frame, and an insert feeding mechanism arranged at the rear end of the loading frame base, by which inserts are periodically fed from the cartridges to the guide members, said insert feeding mechanism comprising a cartridge base on which cartridges are placed, and means for intermittently elevating the cartridge base.

5. The apparatus according to claim 4 further comprising a forced feed means comprising a hydraulic cylinder and feeding fingers connected to the rod of the cylinder.

* * * * *